US012628545B2

(12) United States Patent
Hawthorne et al.

(10) Patent No.: US 12,628,545 B2
(45) Date of Patent: May 12, 2026

(54) ORGANIC VAPOR JET PRINTING SYSTEM

(71) Applicant: UNIVERSAL DISPLAY CORPORATION, Ewing, NJ (US)

(72) Inventors: Jeff Hawthorne, Palo Alto, CA (US); Sriram Krishnaswami, Saratoga, CA (US); Kent Khuong Nguyen, San Jose, CA (US)

(73) Assignee: Universal Display Corporation, Ewing, NJ (US)

( * ) Notice: Subject to any disclaimer, the term of this patent is extended or adjusted under 35 U.S.C. 154(b) by 663 days.

(21) Appl. No.: 18/100,820

(22) Filed: Jan. 24, 2023

(65) Prior Publication Data

US 2023/0255098 A1      Aug. 10, 2023

Related U.S. Application Data

(60) Provisional application No. 63/345,160, filed on May 24, 2022, provisional application No. 63/308,455, filed on Feb. 9, 2022.

(51) Int. Cl.
| | |
|---|---|
| *H10K 71/60* | (2023.01) |
| *C23C 14/12* | (2006.01) |
| *C23C 14/22* | (2006.01) |
| *C23C 14/50* | (2006.01) |

(52) U.S. Cl.
CPC ............ *H10K 71/611* (2023.02); *C23C 14/12* (2013.01); *C23C 14/228* (2013.01); *C23C 14/50* (2013.01)

(58) Field of Classification Search
CPC ....... C23C 14/12; C23C 14/228; C23C 14/50; H01L 21/6838; H01L 21/68735; H01L 21/68785; H10K 59/1201; H10K 71/611
See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.

(Continued)

*Primary Examiner* — Jaehwan Oh
(74) *Attorney, Agent, or Firm* — Butzel Long

(57) ABSTRACT

A chuck for holding a workpiece in a deposition system is provided, which includes a base having a base surface with a flatness tolerance of not greater than 30 μm and a clamp having a surface configured to be attached to a substrate, which has a flatness tolerance of not greater than 30 μm. The clamp also includes a substrate holder configured to hold a substrate above the second clamp surface.

19 Claims, 4 Drawing Sheets

(56) References Cited

U.S. PATENT DOCUMENTS

| | | | |
|---|---|---|---|
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 6,537,688 | B2 | 3/2003 | Silvernail |
| 6,597,111 | B2 | 7/2003 | Silvernail |
| 6,664,137 | B2 | 12/2003 | Weaver |
| 6,835,950 | B2 | 12/2004 | Brown |
| 6,888,305 | B2 | 5/2005 | Weaver |
| 6,888,307 | B2 | 5/2005 | Silvernail |
| 6,897,474 | B2 | 5/2005 | Brown |
| 7,187,119 | B2 | 3/2007 | Weaver |
| 7,279,704 | B2 | 10/2007 | Walters |
| 7,431,968 | B1 | 10/2008 | Shtein |
| 7,683,534 | B2 | 3/2010 | Weaver |
| 7,968,146 | B2 | 6/2011 | Wagner |
| 2003/0230980 | A1 | 12/2003 | Forrest |
| 2004/0174116 | A1 | 9/2004 | Lu |
| 2005/0093666 | A1* | 5/2005 | Miyajima .............. G03F 7/707 335/285 |
| 2008/0094081 | A1* | 4/2008 | Nguyen ................. G09G 3/006 324/750.19 |
| 2015/0380294 | A1* | 12/2015 | Glasko ............... H01L 21/6838 279/3 |
| 2017/0229663 | A1 | 8/2017 | Tsai |
| 2018/0108559 | A1* | 4/2018 | Balan ................. H01L 21/6838 |
| 2019/0086816 | A1* | 3/2019 | Krol ................... G03F 7/70708 |
| 2020/0243481 | A1* | 7/2020 | Chung ............. H01L 21/68757 |
| 2022/0059393 | A1* | 2/2022 | Lee ...................... B25B 11/005 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

ORGANIC VAPOR JET PRINTING SYSTEM

CROSS-REFERENCE TO RELATED APPLICATIONS

This application claims the priority benefit of U.S. Patent Application Ser. No. 63/308,455, filed Feb. 9, 2022, the entire contents of which are incorporated herein by reference.

FIELD

The present invention relates to devices and techniques for fabricating organic emissive devices, such as organic light emitting diodes, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-S00 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
| --- | --- |
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; |

-continued

| Color | CIE Shape Parameters |
| --- | --- |
| Central Yellow | Interior: [0.2268, 0.3321] Locus: [0.373 1, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device for holding a workpiece in a material deposition system is provided, which includes a clamp comprising: a first clamp surface attached to the base surface; a second clamp surface configured to be attached to a substrate, the second clamp surface having a flatness tolerance of not greater than 30 µm, 20 µm, 10 µm, 5 µm, 2 µm, 0.5 µm, or 0.1 µm; and a substrate holder configured to hold a substrate above the second clamp surface and comprising a vacuum chuck, a pressure-vacuum (PV) chuck, an electrostatic chuck, or a combination thereof. The device may include a base having a base surface with a flatness tolerance of not greater than 30 µm, 20 µm, 10 µm, 5 µm, 2 µm, 0.5 µm, or 0.1 µm.

According to an embodiment, a method of fabricating a pressure-vacuum chuck is provided, which includes obtaining a substrate support device having a first surface; and adjusting the flatness of the first surface using a closed-loop polishing process with optical interferometric measurement of a global surface flatness of the at least one surface. The chuck may include any combination of features of the device for holding a workpiece as disclosed herein.

BRIEF DESCRIPTION OF THE DRAWINGS

FIG. 6 shows a deposition system including a chuck as disclosed herein arranged in an upward-facing mode.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
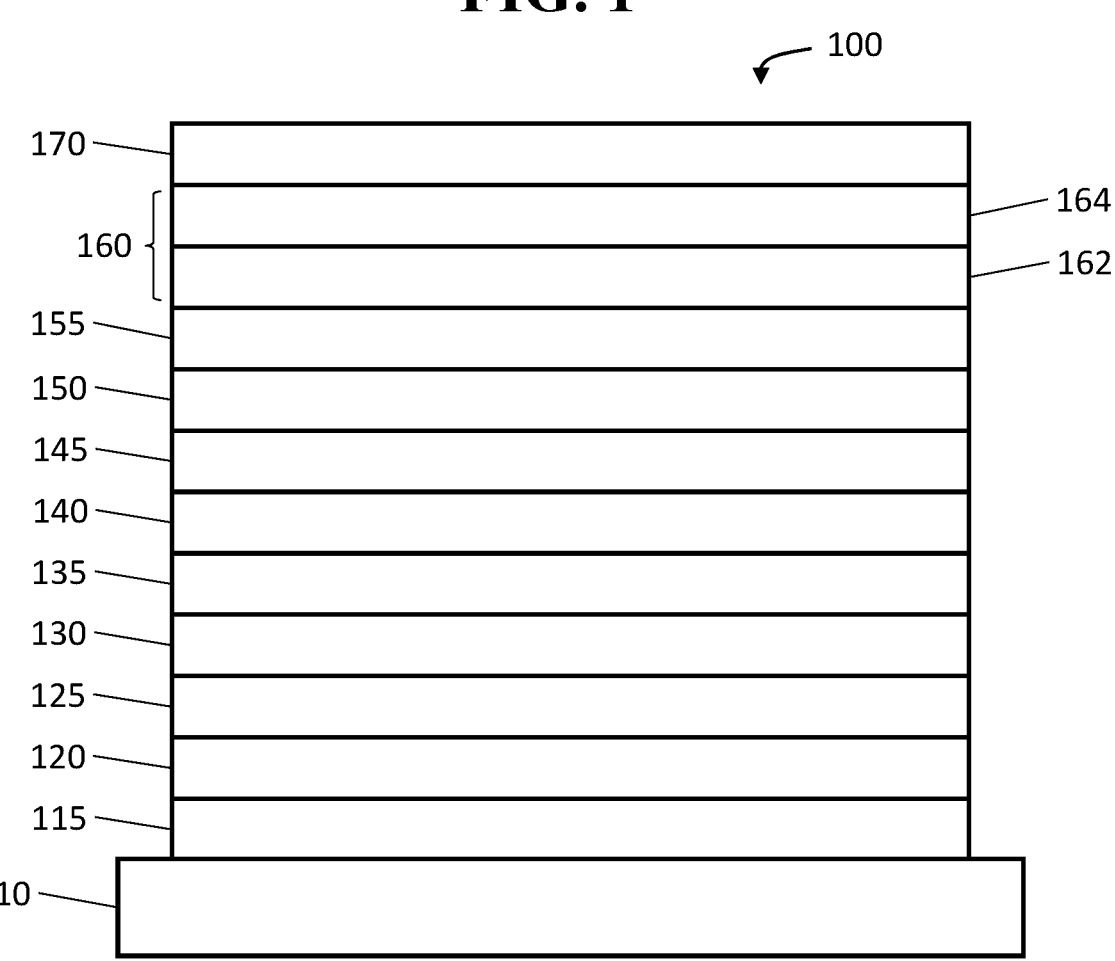
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
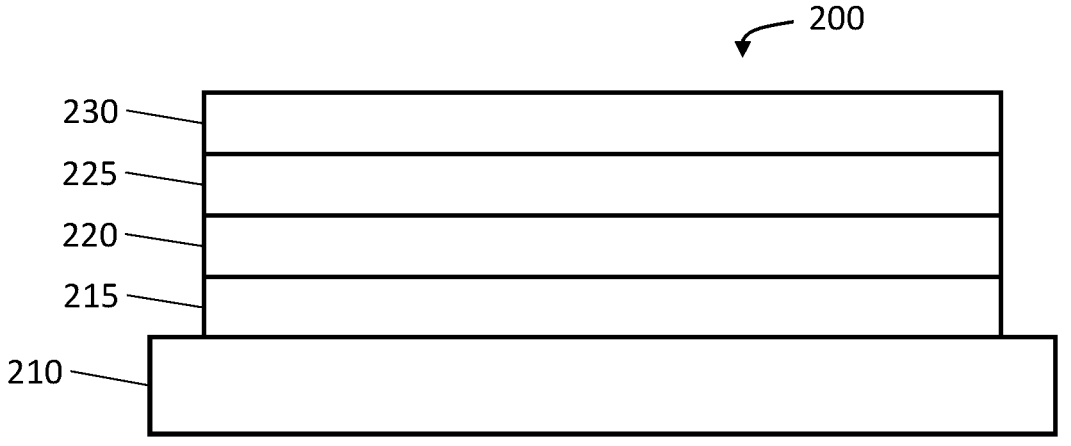
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from –40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, one type of technique for fabricating OLEDs such as active matrix OLEDs (AMOLEDs) and similar devices is OVJP. In OVJP, a substrate workpiece may be placed in a deposition chamber for fabrication of the organic and other layers on the substrate.

A "chuck" generally refers to a tool or component for holding or clamping a workpiece in such systems and similar systems. A vacuum chuck typically uses vacuum force to provide the holding or clamping force. Similarly, a "PV" chuck or mechanism uses a combination of pressured gas (P) and a vacuum (V) to provide vertical support for the glass. One important property of a chuck, especially for systems designed to manipulate larger substrates, is the flatness of the chuck. As used herein, the "flatness" of a chuck refers to the waviness of the surface of the chuck in the vertical direction. This waviness may be measured by contact measurements with a stylus or through optical methods such us interferometry. Existing single-piece chucks for large-area substrates, such as those having edge dimensions on the order of 0.5 m, typically have a surface flatness in the range of 30 to 50 microns. Existing solutions for chucking (i.e., holding with a chuck) large-area substrates are not able to provide much lower surface flatness, and are far from being able to provide a sub-micron flatness as a reference surface for large substrates. However, for advanced applications, such as deposition of the active emitter materials of AMOLED displays, cost effective and high throughput solutions require a sub-micron flat reference surface for the substrate because any non-uniformity under an OLED printhead typically causes a corresponding non-uniformity in the OLED materials deposited on the substrate.

Embodiments disclosed herein provide arrangements for such a chuck, which provide surface flatness of large area substrates less than 30 microns, preferably less than 20 microns, preferably less than 10 microns, preferably less than 5 microns, preferably less than 2 microns, preferably less than 1 micron, more preferably in the range of 0.1 microns to 0.5 microns. As used herein, the "flatness" or "flatness tolerance" of a large-area substrate refers to the flatness over the entire surface area of the substrate as opposed to local flatness when considering an isolated portion of the substrate. That is, the terms refer to the maximum variation in flatness across the substrate as a whole. For example, a flatness tolerance of 0.1 μm means that the maximum height difference between a highest point on the substrate and a lowest point on the same surface of the substrate is not more than 0.1 μm. Similarly, a "sub-micron"

flatness means that the substrate has a uniform flatness of not more than 1.0 microns across the surface of the substrate, such that there is not more than a 1.0 micron difference between the highest and lowest points on the active surface of the substrate.

Multi-layered chuck surfaces as disclosed herein may provide such a reference surface for supporting large substrates up to 4 m×4 m. Chuck arrangements as disclosed herein may be referred to as Base Layer and Clamp (BLC) chucks.

A BLC chuck as disclosed herein has a multi-layered structure, which includes a flat reference base and a clamp, each of which has in-plane dimensions on the order of the display substrate to be held by the chuck. The clamp attaches to the base and the chuck as a whole may provide a sub-micron flat reference surface on the clamp, on which glass (or other display substrates) can be loaded/unloaded and also transported under mechanisms that dispense AMOLED materials such as OVJP systems. The clamp may use any suitable mechanism for securing the substrate and conforming the glass to the surface of the chuck, such as vacuum, Pressure-Vacuum (PV), electrostatic, or combinations thereof. In embodiments in which a BLC chuck as disclosed herein uses direct physical contact between the substrate and the immediately-adjacent surface of the BLC chuck, active and/or passive mechanisms may be used to neutralize any charges on the large display substrate and on the BLC chuck surface. A BLC chuck as disclosed herein may be capable of holding the active surface facing up, or alternatively with the active surface facing down. As used herein, the "active" surface of the substrate refers to the surface on which material is to be deposited, which may have been treated with other processes to enable the desired deposition.

Figure 3:
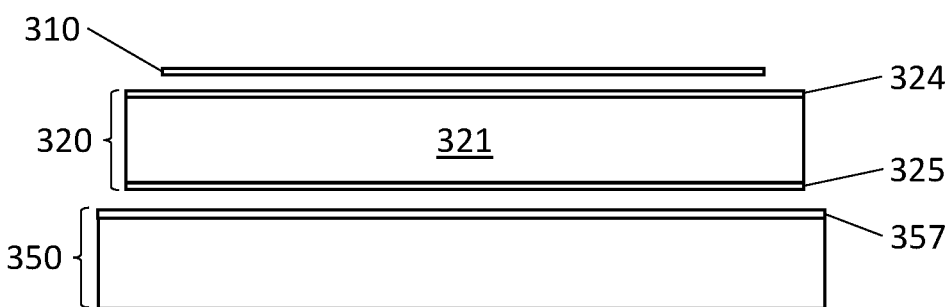
FIG. 3 shows an example of a workpiece chuck as disclosed herein.

FIG. 3 shows an example BLC chuck according to embodiments disclosed herein. A substrate 310 which may be or include one or more substrates 110, 210 as previously disclosed, may be held against one surface of the clamp 320. The clamp may include two surfaces 324, 325, one or both of which may have been treated to achieve a desired surface flatness as disclosed herein. The BLC chuck also includes a base 350, which may have a surface 357 that has been treated to achieve a desired flatness as disclosed herein. The base layer 350 may be fabricated from glass and/or other dielectric materials. The base 350 may be designed with structural features to reduce its weight, for example, using a honeycomb or other lattice structure for internal structure and support.

The base surface 357 typically will be immediately adjacent to, and/or in direct physical contact with, the clamping surface 325. The other surface of the clamp 324 is immediately adjacent to, and/or in direct physical contact with, the substrate 310 that is being held by the BLC chuck during operation. That is, though they are shown as separated by a visible distance in the drawings for ease of illustration, during operation of the BLC chuck, typically the substrate may be in direct physical contact with, or separated from the clamp by a relatively short gap, for example about 1-30 μm or, in some embodiments, up to 100 μm. Shorter gaps of about 1-5 μm typically are more suitable for use with electrostatic clamp chucks, with larger gaps of about 5 μm or more being more suitable for PV-type clamp chucks. Similarly, the base surface may be in direct physical contact with the clamp or, in some embodiments, separated from the clamp by 1 mm or more, up to several hundred millimeters.

The surfaces 324 and 357 may be treated and held to tight flatness tolerances, preferably of 0.1 to 0.5 microns, more generally to a flatness tolerance of less than 30 microns, preferably less than 20 microns, preferably less than 10 microns, preferably less than 5 microns, preferably less than 2 microns, preferably less than 1 micron, more preferably in the range of 0.1 microns to 0.5 microns. The substrate-facing surface 324 also may have such a flatness tolerance across the entire distance of the substrate that corresponds to a dimension of a print engine or print bar as disclosed herein. For example, the surface 324 may have a flatness tolerance of 1 micron or less, while being usable in a deposition system having a print engine that extends 100 mm, 120 mm, 130 mm, 140 mm, 150 mm, or more across the width of the substrate. The flatness of the two surfaces 324, 357 may be the same, or each may be held to a different tolerance.

For large substrates that can be manipulated using the BLC chuck arrangement disclosed herein, it has been found that where a clamp should provide a suitably flat surface for the substrate, the clamp itself may sag or have surface irregularities that are translated through to the substrate, thus resulting in the substrate having a lower surface flatness tolerance (i.e., higher variability in surface flatness). Accordingly, in some embodiments the base 350 may provide structural support for the clamp 320. That is, the base layer 350 and the base surface 357 may provide a reference flatness for the clamp 320 and specifically for the clamp surface 325, which in turn may provide support and/or a reference surface flatness for the substrate-facing surface 324.

To achieve the desired flatness tolerance, techniques not currently known or employed in the flat panel manufacturing art may be used. For example, large glass mirror surfaces can be manufactured to 0.01 micron flatness over distances often extending 5 meters, such as in the manufacture of large optical telescopes that are sent into space for astronomical observations. The manufacturing of such telescopes requires closed loop polishing techniques, in which the surface flatness is polished in conjunction with surface flatness measurement using optical interferometric methods. Such mirror surfaces typically are made of glass. In embodiments disclosed herein, it has been discovered that similar methods may be applied to the chuck materials used in applications such as AMOLED material deposition on large substrates, for example having a largest edge dimension of 3 m, 3.5 m 4 m or more, or up to 3×3 m, 3×4 m, or 4×4 m. Embodiments disclosed herein also may be particularly suited to holding relatively thin large-area substrates, such as those having a thickness of 7 mm, 6 mm, 5 mm, or less, with the edge dimensions and areas previously disclosed.

The clamp 320 may use any suitable substrate holder mechanism to hold the substrate 310 in a desired arrangement. For example, as previously disclosed, the clamp may use vacuum chucking, PV chucking, electrostatic chucking or combinations thereof. The clamp may include various control mechanisms and combinations of such clamping techniques to allow for arbitrary distribution of clamping force through the judicious design of these clamping features. Furthermore, the substrate 310 may be held in place without a physical gripper or equivalent component, thereby eliminating perimeter effects on glass flatness.

In some embodiments, the clamping features and mechanisms may be disposed partially or entirely within the clamp interior 321 of the clamp 320, so as to present a uniformly flat top surface 324 to the substrate 310. For example, vacuum and/or pressure delivery lines, conductive electrodes, which may be embedded in dielectric materials, or the like, or any combination thereof, may be disposed within the interior 321 of the clamp 320.

In some embodiments, the base 350 and/or the clamp 320 may include-hole features to allow for glass to be attached to and separated from the surface 324. For example, lift pins may extend through such through-holes from the base 350 and/or the base 320 to allow for easy and/or uniform attachment and separation of the substrate 310 to/from the clamp surface 324. As another example, the through-holes may provide gas channels for pressure control, vacuum control, or the like. The surface 324 also may include raised geometric features to aid in easy attachment and removal of the glass and/or to prevent particle entrapment between the glass and the surface 324.

As previously disclosed, the key surfaces 324, 325, 357 may be polished to a high degree of flatness, for example using closed-loop polishing techniques combined with continuous, regular, intermittent, or otherwise recurring precise measurement of the flatness of the surface, for example using optical interferometric measurement, laser-based measurement, or other techniques. The polishing operations may be performed on the base surface 357, and one or more of the clamp surfaces 324, 325 separately before assembly of the base 350 and the clamp 320. The manufacturing processes may include integrated metrology as well. Control and measurement of the flatness of these surfaces may benefit from control of residual stresses of the surfaces and the underlying material, as well as the use of materials with relatively low coefficient of thermal expansion. For example, it may be desirable to reduce or eliminate residual stresses on layers of the BLC chuck device; any residual stresses may deform the chuck surface and thus damage or destroy the flatness of the chuck surface.

Other structural features and material properties may be used for a BLC chuck as disclosed herein. For example, the clamp 320 may be fabricated from materials and using design features to prevent charge buildup on the clamp 320 and/or the substrate 310, such as dielectric electrode patterns, dielectric material use, selection of appropriate feature thickness or variation thereof, or the like. The BLC chuck also may be ultra-high-vacuum (UHV) compliant through use of appropriate materials, mechanical construction, and electrical construction.

Figure 4:
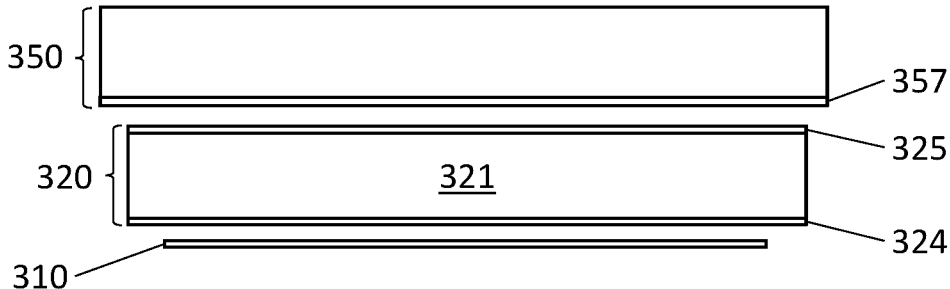
FIG. 4 shows an example of the workpiece chuck of FIG. 3 arranged in a downward-facing mode.

A BLC chuck as disclosed herein may be used in different orientations. FIG. 3 shows the chuck and substrate arranged with the substrate facing up (Mode U), i.e., toward the top of the page and opposite the force of gravity in a deposition system. In this arrangement, the depositor, such as an OVJP printhead or similar, is positioned above the substrate and chuck relative to the force of gravity. Alternatively, the system may be oriented with the chuck positioned above substrate as shown in FIG. 4, i.e., with the substrate facing down (Mode D). In this arrangement, the depositor is arranged below the substrate relative to the force of gravity. For applications such as printing active emitter material for an AMOLED or similar device, the two modes of the BLC chuck allow the deposition from above (using Mode U) or from below (using mode D).

Figure 5:
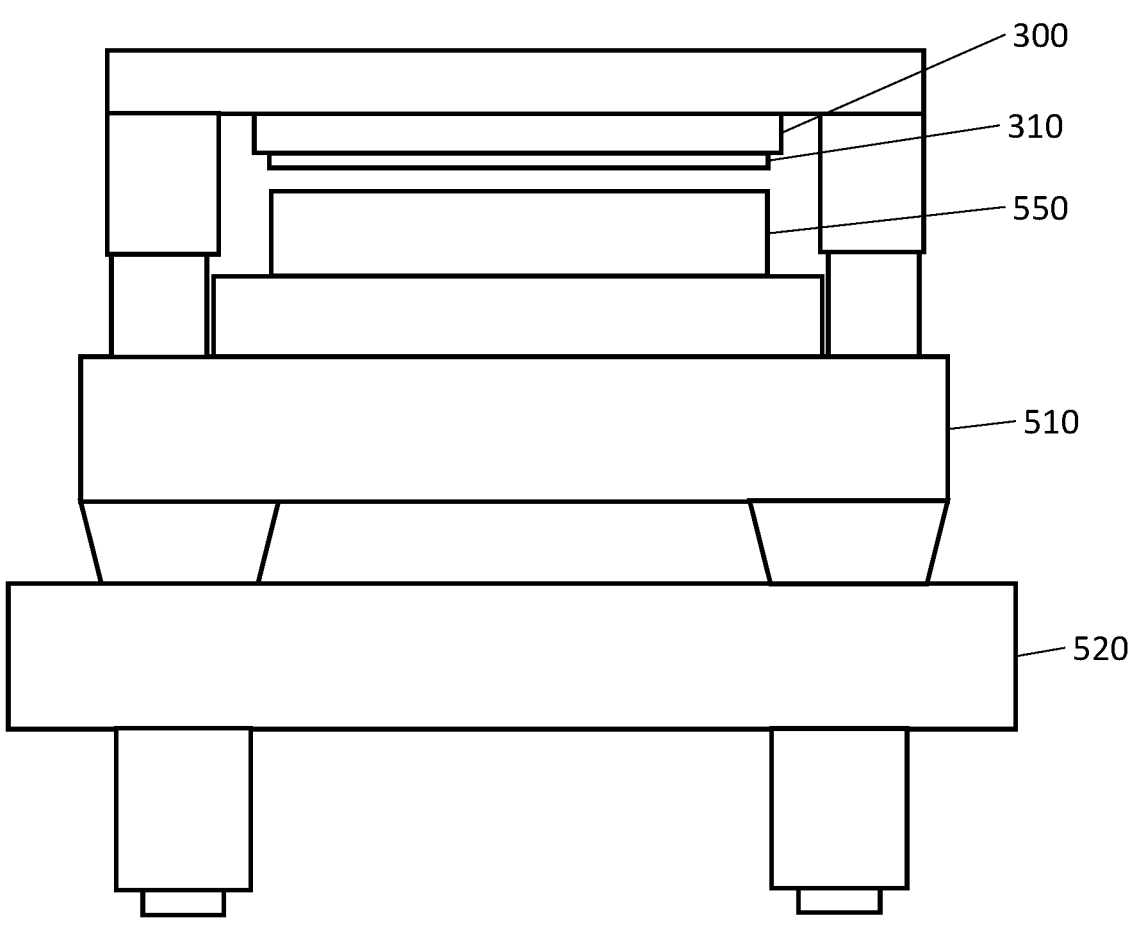
FIG. 5 shows a deposition system including a chuck as disclosed herein arranged in a downward-facing mode.

FIG. 5 shows an end view of an example deposition system, such as an OVJP system, arranged to operate in Mode U. The BLC chuck 300 holds a substrate 310 above a print engine having one or more print bars 550 as previously disclosed. The print bars 550 deposit upward toward the active surface of the glass. The system may include a table 510 with one or more supports 520, for example to dampen vibrations from the environment as is known in the art.

Figure 6:
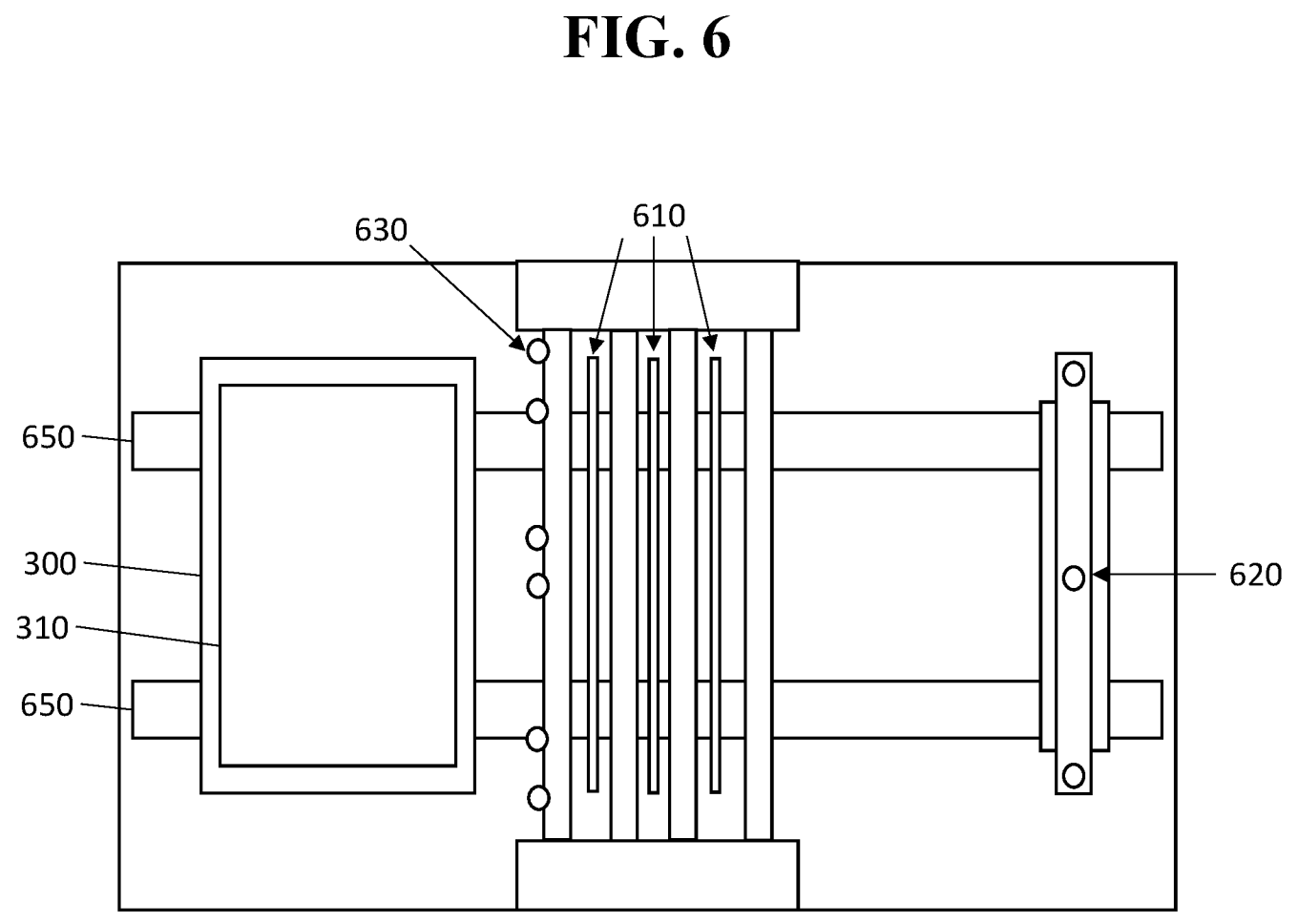

FIG. 6 shows a top-down view of an example deposition system, such as an OVJP system, arranged to operate in Mode D. In this mode, a print engine having one or more print bars 610 provide a deposition mechanism for materials, such as AMOLED emitter materials, to be deposited on the substrate that is attached to the BLC chuck 300. In this embodiment, the substrate is held with its active surface facing up and with the print bars depositing downward toward the active surface of the substrate as previously disclosed. The system may include other features used in OVJP and similar systems, such as in-situ calibration and/or metrology components 820, alignment cameras 630, and the like. The BLC chuck may be moved through the system along a primary y-axis, such as via one or more rails 650, or it may be moved on or integrated with a PV float table or similar mechanism. In some embodiments, the substrate may be floated on the BLC chuck, for example using a PV-based clamp as previously disclosed and remain static on the BLC chuck or a supporting table. In other systems, the substrate often is floated across a larger float table, which can lead to sagging or other deformities in the substrate. By keeping the substate stationary relative to the BLC chuck or a supporting float table, which is then moved as a whole through a system such as shown in FIG. 6, such deformities may be reduced. Further, this arrangement may provide for improved deposition efficiency. Examples of suitable float tables and related arrangements are described in further detail in U.S. Application Publication No. 2022/0190245, filed Dec. 13, 2021, the disclosure of which is incorporated by reference in its entirety.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device for holding a workpiece in a material deposition system, the device comprising:
   a base having a base surface with a flatness tolerance of not greater than 30 μm; and
   a clamp comprising:
      a first clamp surface attached to the base surface;
      a second clamp surface configured to be attached to a substrate, the second clamp surface having a flatness tolerance of not greater than 30 μm; and
      a substrate holder configured to hold a substrate above the second clamp surface.

2. The device of claim 1, the substrate holder further comprising a vacuum chuck, a pressure-vacuum (PV) chuck, an electrostatic chuck, or a combination thereof.

3. The device of claim 1, wherein the flatness tolerance of the base surface is not greater than 20 μm.

4. The device of claim 1, wherein the flatness tolerance of the second clamp surface is not greater than 20 μm.

5. The device of claim 4, wherein the second clamp surface has a flatness tolerance of not greater than 0.5 μm.

6. The device of claim 1, wherein the second clamp surface is sufficient large to hold and support a substrate having a largest edge dimension of 3 m or more.

7. The device of claim 6, wherein the second clamp surface is sufficiently large to hold and support a substrate having a thickness of 7 mm or less.

8. The device of claim 1, further comprising a print engine disposed adjacent to the clamp such that a substrate held by the substrate holder is disposed between the print engine and the clamp.

9. The device of claim 8, wherein the flatness tolerance of the second clamp surface is not greater than 1 μm and the print engine extends across a width of at least 100 mm.

10. The device of claim 1, wherein the second clamp surface has the same flatness tolerance as the base surface.

11. The device of claim 1, wherein the base surface comprises glass and/or other dielectric materials.

12. The device of claim 1, wherein the base comprises a lattice structure.

13. The device of claim 1, wherein the base and/or the clamp comprise one or more through-holes for the substrate holder.

14. The device of claim 13, wherein the through-holes comprise gas channels for pressure and/or vacuum control.

15. The device of claim 13, further comprising lift pins disposed in and through the through-holes.

16. The device of claim 1, wherein the second clamp surface comprises raised features configured to provide for attachment of a substrate to the substrate holder.

17. The device of claim 1, wherein the device comprises materials that are ultra-high vacuum (UHV) compliant.

18. A method of fabricating a pressure-vacuum chuck, the method comprising:
   obtaining a substrate support device having a first surface; and
   adjusting the flatness of the first surface using a closed-loop polishing process with optical interferometric measurement of a global surface flatness of the at least one surface.

19. The method of claim 18, wherein the substrate support device comprises: a base; and a clamp comprising: a first clamp surface attached to the base; a second clamp surface configured to be attached to a substrate; and a substrate holder configured to hold a substrate above the second clamp surface and comprising a vacuum chuck, a pressure-vacuum (PV) chuck, an electrostatic chuck, or a combination thereof; the method further comprising attaching the clamp and the base.

* * * * *